United States Patent
Kimata et al.

[11] Patent Number: 6,051,776
[45] Date of Patent: Apr. 18, 2000

[54] LIGHT CONDENSING-TYPE SOLAR GENERATOR SYSTEM

[75] Inventors: Ryuichi Kimata; Noboru Kawaguchi, both of Wako, Japan

[73] Assignee: Honda Giken Kogyo Kabushiki Kaisha, Tokyo, Japan

[21] Appl. No.: 09/265,572

[22] Filed: Mar. 10, 1999

[30] Foreign Application Priority Data

Mar. 11, 1998 [JP] Japan .................................. 10-059893

[51] Int. Cl.$^7$ .......................... H01L 31/052; H01L 31/05
[52] U.S. Cl. .......................... 136/246; 136/256; 126/624
[58] Field of Search .................... 136/259, 246, 136/248, 256, 257; 250/239; 126/624

[56] References Cited

U.S. PATENT DOCUMENTS

| | | | |
|---|---|---|---|
| 3,368,078 | 2/1968 | Flint et al. ................................ | 250/216 |
| 4,830,678 | 5/1989 | Todorof et al. .......................... | 136/259 |
| 4,933,022 | 6/1990 | Swanson . | |
| 5,118,361 | 6/1992 | Fraas et al. ............................. | 136/246 |
| 5,460,659 | 10/1995 | Krut ....................................... | 136/246 |
| 5,707,458 | 1/1998 | Nagashima et al. .................... | 136/246 |

FOREIGN PATENT DOCUMENTS 7-231111  8/1995  Japan .

*Primary Examiner*—Nam Nguyen
*Assistant Examiner*—Michael C. Miggins
*Attorney, Agent, or Firm*—Arent Fox Kintner; Plotkin & Kahn PLLC

[57] ABSTRACT

A solar battery cell of a back-electrode type is used to enhance the photo-electric efficiency in which the electrical connecting structure for the solar battery cell is simplified, and the deterioration of connected portions can be prevented. The solar battery cell of a back-electrode type having second electrodes on the back thereof, are placed on and fixed to a board having first electrodes on its surface, so that the first electrodes and the second electrodes are electrically connected to each other. Output terminals are connected to the first electrodes on the board outside of and to the side of the solar battery cell, by soldering. A truncated conical light guide having a larger diameter-end face serving as a light receiving end face is placed on and fixed to a surface of the solar battery cell with the light receiving end face disposed in the vicinity of the focal point of the lens.

6 Claims, 5 Drawing Sheets

LIGHT CONDENSING-TYPE SOLAR GENERATOR SYSTEM

BACKGROUND OF THE INVENTION

1. Field of the Invention

The present invention relates to a light condensing-type solar generator system for condensing sun rays into a solar battery cell, to produce electric power by photo-electrical conversion.

2. Description of the Prior Art

A light condensing-type solar generator system for condensing sun rays into a solar battery cell with a lens to effectively utilize the capability of the solar battery cell, to reduce generating cost is already known, for example, from Japanese Patent Application Laid-Open No. 7-231111.

The light condensing-type solar generator system disclosed in the above Japanese Patent Application Laid-Open No. 7-231111 is of a structure wherein a small sized solar battery cell with one side as small as 2 mm, is connected to an IC type carrier such as a dual in-line package or the like. The carrier is mounted so that it is inset into a printed circuit board such as a through-hole board, whereby a plurality of solar battery cells are electrically connected to one another.

However, the electrical connecting arrangement of the known solar generator system is difficult to apply where the size of the solar battery cell is increased for obtaining large electric power. When a large-sized solar battery cell is used, a soldering or brazing structure must be relied on. However, when the magnification of condensation of light rays to the solar battery cell exceeds 100, the deterioration of connected portions provided by soldering or the like is hastened, if the converged light rays are applied to the connected portions.

On the other hand, an attempt is made (in U.S. Pat. No. 4,933,022) to use a solar battery cell of a back-electrode type having an electrode on the back rather than on the surface to which sun rays are applied, for enhancing the photo-electrically converting efficiency of the solar battery cell, thereby absorbing sun rays into the solar battery cell without the electrode shielding of the sun rays. However, to avoid raising the temperature of the solar battery cell due to the condensation of sun rays, for example, at a magnification of 100 or more, it is required that a radiating plate or the like, for effectively cooling the solar battery cell, be mounted on the back of the solar battery cell. For this reason, when the solar battery cell of the back-electrode type is used, a special contrivance is required for the electrical connecting structure for the solar battery cell.

SUMMARY OF THE INVENTION

The present invention has been accomplished with such circumstances in view, and it is an object of the present invention to provide a light condensing-type solar generator system, wherein a solar battery cell of a back-electrode type is used in order to enhance the photo-electric efficiency. The electrical connecting structure for the solar battery cell can be simplified, and the deterioration of the connected portions can be prevented.

To achieve the above object, there is provided a light condensing-type solar generator system comprising a back electrode solar battery cell for converting sun rays photo-electrically, and a lens for condensing and focusing the sun rays onto the solar battery cell. The solar generator system further includes a substrate having first electrodes on its surface, the solar battery cell of a back-electrode type having second electrodes on the back thereof which are placed on and fixed to the board, so that the first electrodes and the second electrodes are electrically connected to each other; and the output terminals are connected to the first electrodes on the board outside of and to the side of the solar battery cell by brazing. A truncated conical light guide which has a larger diameter-end face serving as a light receiving end face, is placed on and fixed to a surface of the solar battery cell with the light receiving end face disposed in the vicinity of the focal point of the lens.

With the above arrangement, the output terminals, which are separate from the board, are connected to the first electrodes formed on the surface of the board by brazing and therefore, the electrical connecting structure is simple and moreover, the connecting process is simplified. In addition, the sun rays condensed by the lens are guided to the surface of the solar battery cell by the light truncated conical guide and hence, the focused sun rays are not applied to the connected portions of the first electrodes and the output terminals, whereby the deterioration of the connected portions due to the application of the sun rays, is prevented.

The junctions of the output terminals to the first electrodes are formed into a comb tooth shape. With such an arrangement, when the output terminals are connected to the first electrodes by brazing, the unnecessary diffusion of heat can be prevented, to thus carry out the connection operation easily and reliably. Moreover, it is possible to moderate the stress applied to the connected portions after completion of the connection.

DETAILED DESCRIPTION OF THE PREFERRED EMBODIMENTS

Figure 1:
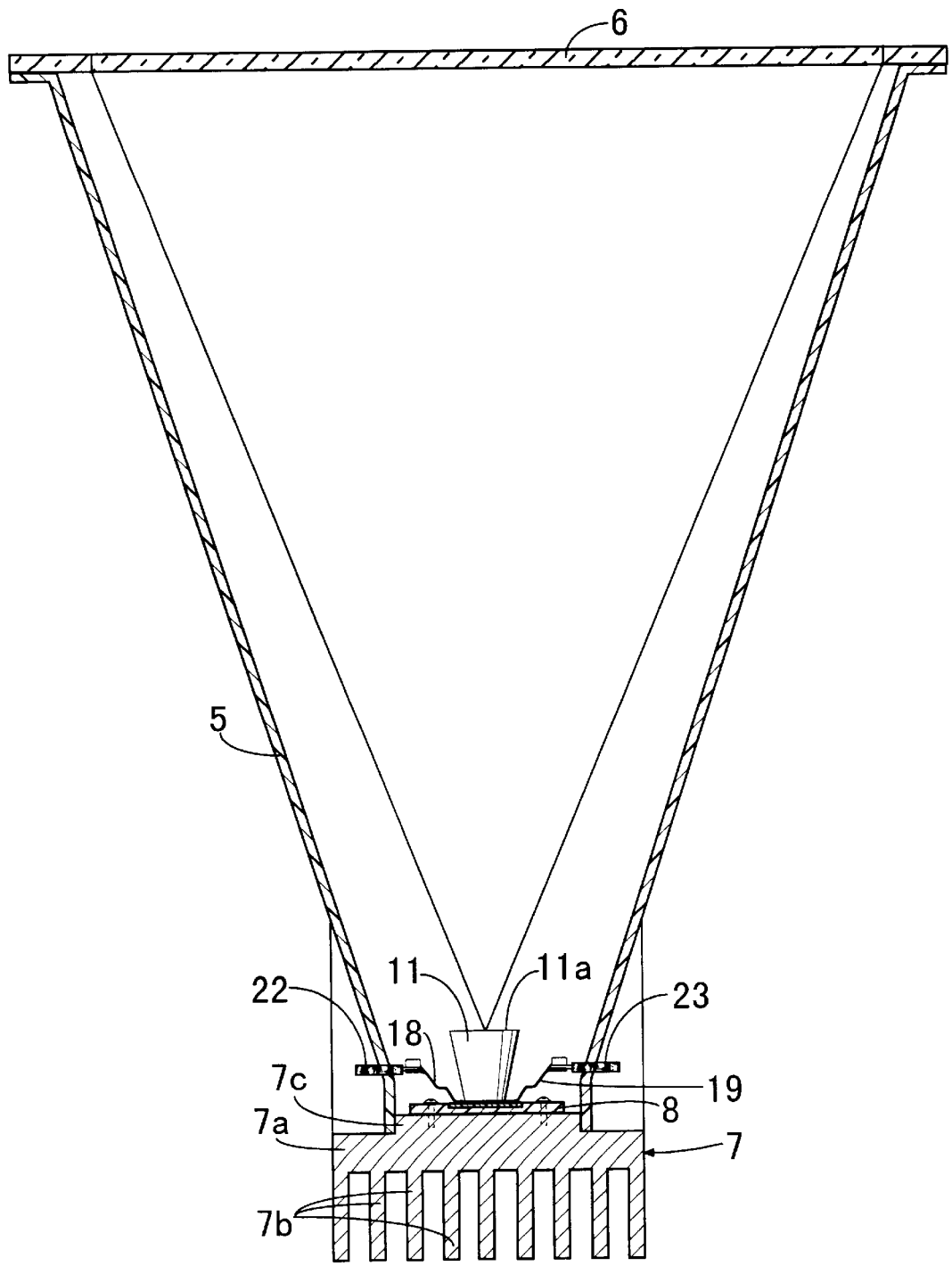
FIG. 1 is a vertical sectional view of a light condensing-type solar generator system according to an embodiment of the present invention.
Figure 2:
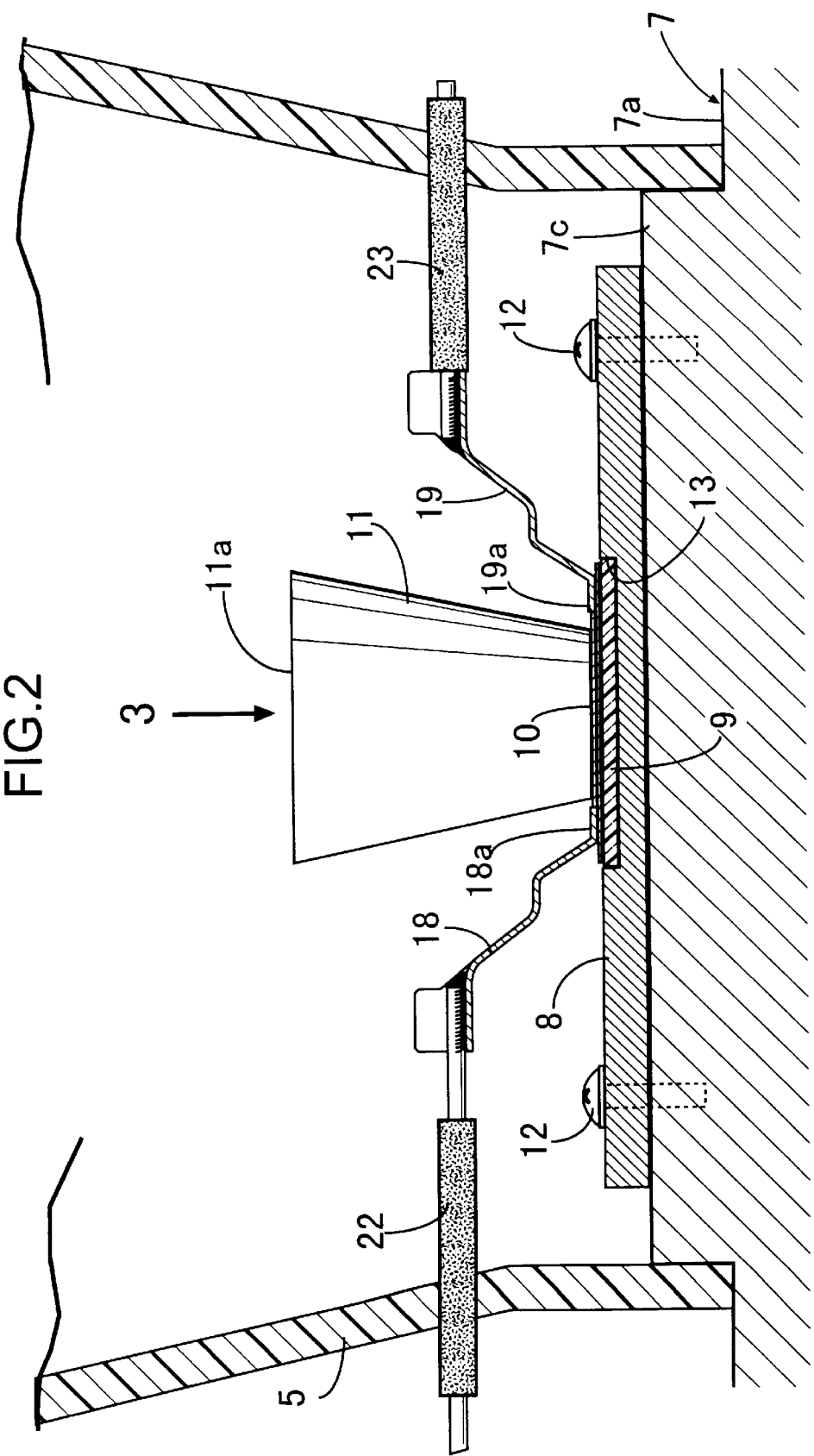
FIG. 2 is an enlarged view of an essential portion shown in FIG. 1.

Referring first to FIGS. 1 and 2, a light condensing-type solar generator system includes a lens frame 5 which is formed into a tube shape which is circular in cross section, with the diameter reduced towards the bottom. A Fresnel lens 6 is fixed to the peripheral edge at the upper end of the lens frame 5, to cover the opening at the upper end of the lens frame 5. Radiating member 7 is coupled to a lower end of the lens frame 5, to cover the opening at the lower end of the lens frame 5, a heat spreader 8 is fastened to a surface of the radiating member 7 within a lower portion of the lens frame 5, and a substrate 9 is adhered onto the heat spreader 8. A back electrode-type solar battery cell 10 is fixedly bonded onto the board 9, and a light guide 11 is mounted on the solar battery cell 10.

The radiating member 7 is formed from a metal such as an aluminum alloy or the like and is integrally provided with a flat plate-shaped base portion 7a, a plurality of radiating fins 7b extending from a back of the base portion 7a, and a fitting projection 7c extending from a surface of the base portion 7a, such that it is fitted into the lower end of the lens frame 5.

Figure 3:
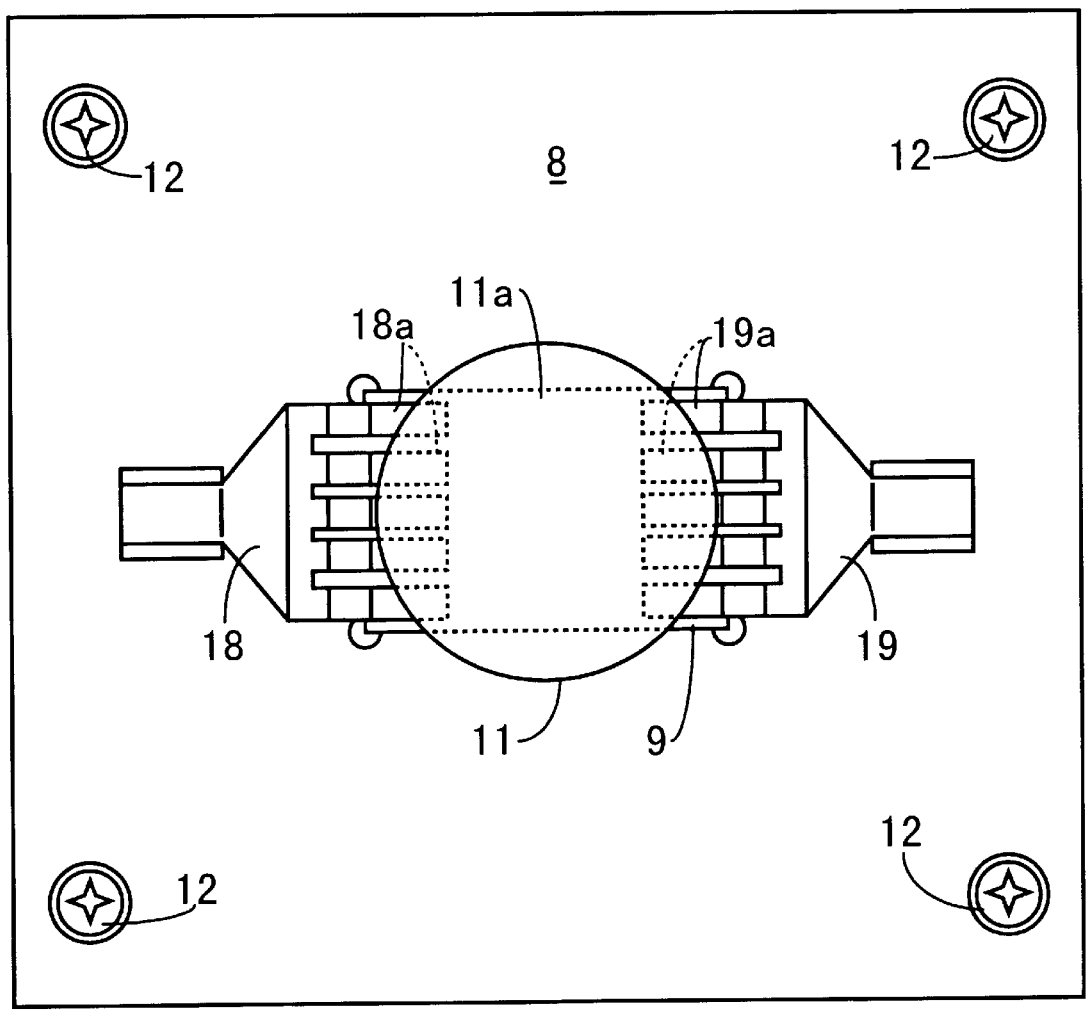
FIG. 3 is a plan view taken in a direction of an arrow 3 in FIG. 2.
Figure 4:
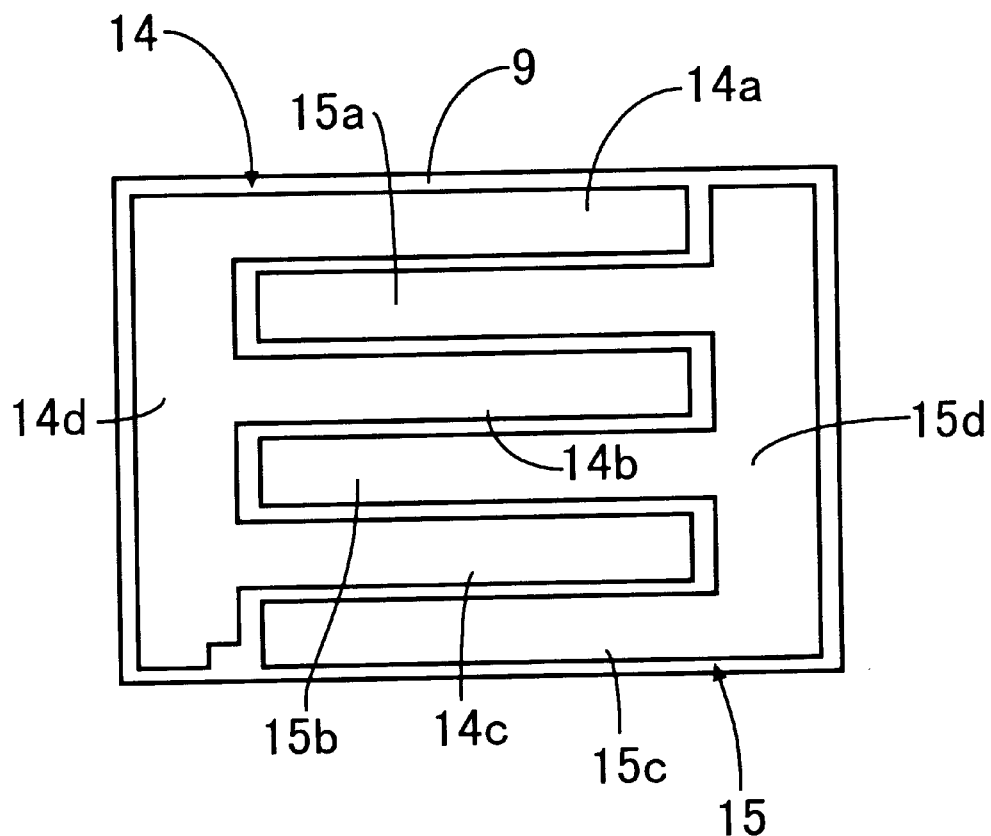
FIG. 4 is a plan view showing a surface of a board according to the embodiment of the present invention.

Referring also to FIG. 3, the heat spreader 8 is formed into a rectangular flat plate shape from a metal such as an aluminum alloy or the like, and is fastened to an upper surface of the fitting projection 7c of the radiating member 7 by a plurality of screw members 12. Moreover, a recess 13 corresponding to the board 9 is provided at a central portion of the upper surface of the heat spreader 8. Referring to FIG. 4, a first positive electrode 14 and a first negative electrode 15 are formed on the surface of the board 9. The first positive electrode 14 is comprised of a plurality of branches, e.g., three branch portions 14a, 14b and 14c extending in parallel to one another at spaced-apart locations, and a joining portion 14d which extends in a direction perpendicular to the branch portions 14a, 14b and 14c and to which one end of the branch portions 14a, 14b and 14c are commonly connected. The first negative electrode 15 is comprised of a plurality of branches, e.g., three branch portions 15a, 15b and 15c which extend in parallel to one another at locations where they are disposed alternately with the branch portions 14a, 14b and 14c of the first positive electrode 14, and whose one ends are disposed at locations spaced apart from the joining portion 14d of the first positive electrode 14, and a joining portion 15d which extends in a direction perpendicular to the branch portions 15a, 15b and 15c, to which the other end of the branch portions 15a, 15b and 15c are commonly connected, and which is disposed at a distance spaced apart from the other ends of the branch portions 14a, 14b and 14c of the first positive electrode 14.

Figure 5:
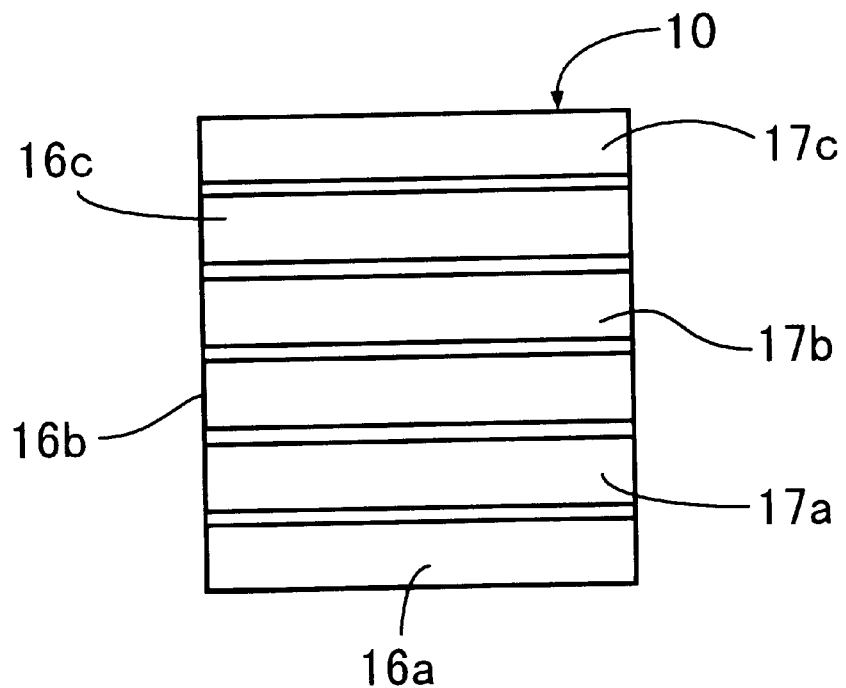
FIG. 5 is a plan view showing a back of a solar battery cell of the according to the embodiment of the present invention.

On the other hand, a plurality of positive electrodes, e.g., three second positive electrodes 16a, 16b and 16c and a plurality of negative electrodes, e.g., three second negative electrodes 17a, 17b and 17c are formed on the back of the solar battery cell 10, as shown in FIG. 5. The second positive electrodes 16a, 16b and 16c extend in parallel to one another in correspondence to the branch portions 14a, 14b and 14c of the first positive electrode 14, and the second negative electrodes 17a, 17b and 17c extend in parallel to one another in correspondence to the branch portions 15a, 15b and 15c of the first negative electrode 15.

The solar battery cell 10 is bonded to the surface of the board 9. In a state in which the solar battery cell 10 has been bonded to the surface of the board 9, the joining portions 14d and 15d of the first positive and negative electrodes 14 and 15 on the surface of the board 9, are disposed outside of and to the side of the solar battery cell 10, and positive and negative output terminals 18 and 19 are connected to the joining portions 14d and 15d, respectively. Moreover, the output terminals 18 and 19 include a plurality of terminal portions 18a and a plurality of terminal portions 19a, respectively, which are formed into a comb tooth shape, so that they are bonded to the joining portions 14d and 15d, extending rectilinearly at a plurality of points spaced apart from one another.

Figure 6:
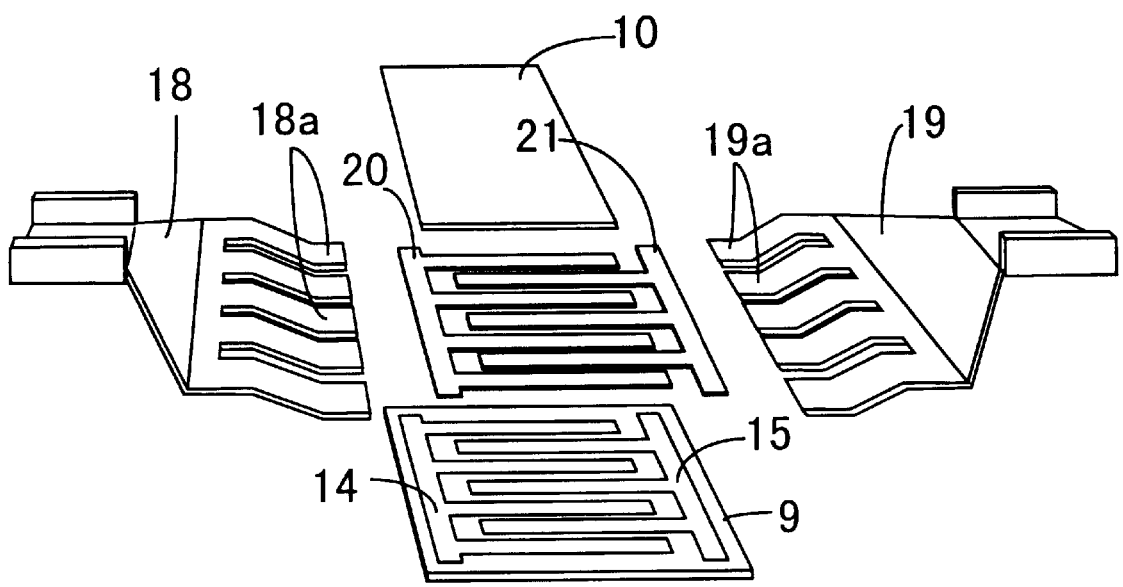
FIG. 6 is an exploded perspective view of an essential portion of a condensing-type solar generator system according to the embodiment of the present invention.

Referring to FIG. 6, to bond the solar battery cell 10 to the board 9 and to bond the output terminals 18 and 19 to the first positive and negative electrodes 14 and 15 on the board 9, solder sheets 20 and 21 corresponding to the electrodes 14 and 15 on the board 9 are prepared and placed and located on the first electrodes 14 and 15 on the board 9, and the solar battery cell 10 is located on the solder sheets 20 and 21. Further, terminals 18 and 19 are disposed on the board 9 in such a manner that the terminal portions 18a and 19a are located on the joining portions 14d and 15d of the first electrodes 14 and 15, respectively. In this state, heating is carried out in a reducing atmosphere. This causes the solder sheets 20 and 21 to become molten, whereby the second electrodes 16a, 16b, 16c, 17a, 17b and 17c of the solar battery cell 10 and the first electrodes 14 and 15 on the board 9 are connected to each other, and the solar battery cell 10 is coupled to the board 9. Further, the output terminals 18 and 19 are connected to the first electrodes 14 and 15 outside of and to the side of the solar battery cell 10.

In a state in which the solar battery cell 10 and the output terminals 18 and 19 have been bonded in the above manner, the board 9 is fitted into the recess 13 in the heat spreader 8 with an adhesive (not shown) interposed between the board 9 and the heat spreader 8, and the board 9 is adhered to the upper surface of the heat spreader 8.

The light guide 11 is formed into a truncated conical shape from an optical lens material, so that the diameter is reduced towards a bottom. The light guide 11 is adhered by an adhesive (not shown) to a central portion of the surface of the solar battery cell 10, with its upper end face, i.e., its larger-diameter end face serving as a light receiving end face 11 a. In this case, if junctions of the first electrodes 14 and 15 and the output terminals 18 and 19 are covered with the adhesive provided between the solar battery cell 10 and the light guide 11, the junctions can be shielded from the outside air, thereby avoiding an adverse effect on the junctions, due to moisture or the like.

The light receiving end face 11a of the light guide 11 is disposed in the vicinity of the focal point of the Fresnel lens 6 upon the adhesion of the light guide 11 to the solar battery cell 10.

Further, conductors 22 and 23 are connected to the output terminals 18 and 19 respectively by soldering or the like, and lead to the outside through the lens frame 5.

The operation of the embodiment will be described below. The solar battery cell 10 of a back electrode type, is employed for the purpose of enhancing the photoelectric efficiency. The electric connecting structure for outputting electric power from the solar battery cell 10 is simple, with the output terminals 18 and 19 separate from the board 9 being connected by soldering to the first electrodes 14 and 15 formed on the surface of the board 9. Moreover, the connecting process can be simplified.

Sun rays condensed by the Fresnel lens 6 are guided to the surface of the solar battery cell 10 by the truncated conical light guide 11. Therefore, focused sun rays are not applied to the connected portions of the first electrodes 14 and 15 and the output terminals 18 and 19 and hence, the deterioration of the connected portions due to the application of the sun rays is prevented.

Further, the junctions of the output terminals 18 and 19 with the first electrodes 14 and 15, i.e., the terminal portions 18a and 19a, are formed into a comb tooth shape and hence, when the output terminals 18 and 19 are soldered to the first electrodes 14 and 15, the occurrence of unnecessary heat diffusion can be prevented, whereby the connection operation can be carried out easily and reliably. Moreover, it is possible to moderate the stress applied to the connected portions after completion of the connection.

The output terminals 18 and 19 have been connected to the first electrodes 14 and 15 by soldering in the described embodiment, however, they may be connected to the first electrodes 14 and 15 by brazing in place of soldering.

As discussed above, the output terminals are separate from the board and are connected to the first electrodes on the surface of the board, whereby the electrical connecting structure can be simplified and moreover, the connecting process can be simplified. In addition, the focused sun rays are not applied to the connected portions of the first electrodes and the output terminals, whereby the deterioration of the connected portions due to the application of the sun rays, can be prevented.

When the output terminals are connected to the first electrodes by brazing, the unnecessary diffusion of heat can be prevented and the connecting operation can be easily and reliably performed, and after completion of the connection, the stress applied to the connected portions can be moderated.

Although the embodiment of the present invention has been described in detail, it will be understood that the present invention is not limited to the above-described embodiment, and various modifications may be made without departing from the subject matter of the present invention.

What is claimed is:

1. A light condensing solar generator system comprising a back electrode solar battery cell for converting sun rays photo-electrically, a lens for condensing and focusing the sun rays onto said solar battery cell, a substrate having first electrodes on the surface thereof, said solar battery cell having second electrodes on a back thereof and being free of electrodes on a front surface thereof, wherein said solar battery cell is directly fixed to said substrate by brazing such that said first electrodes and said second electrodes are electrically connected to each other, output terminals connected to said first electrodes on said substrate by brazing at locations outside of and to the side of said solar battery cell, a light guide having a truncated conical shape and having a larger diameter end face serving as a light receiving end face, wherein a focal point of said lens is disposed around said light receiving end face of said light guide, wherein said light guide is fixed to a surface of said solar battery cell, and wherein said output terminals include a plurality of comb-tooth portions, said comb-tooth portions being connected to said first electrodes.

2. A light condensing solar generator according to claim 1, wherein said focal point of said lens is disposed in the large diameter end face of said light guide.

3. A light condensing solar generator system according to any one of claims 1 and 2, wherein said light guide is formed from an optical lens material.

4. A light condensing solar generator system according to claim 1, wherein said first and second electrodes each comprise a plurality of branch portions with distances therebetween and joining portions for connecting said branch portions.

5. A light condensing solar generator system according to claim 1, wherein said first and second electrodes each comprise a plurality of branch portions with distances therebetween and joining portions for connecting said branch portions.

6. A light condensing solar generator system according to claim 5, wherein said comb-tooth portions of each of said output terminals are connected to said joining portions of said first electrodes, respectively.

* * * * *